United States Patent
Kim (10) Patent No.: US 12,101,950 B2
(45) Date of Patent: Sep. 24, 2024

(54) HIGHLY EFFICIENT INVERTED POLYMER SOLAR CELLS USING AN INDIUM GALLIUM ZINC OXIDE INTERFACIAL LAYER

(71) Applicant: University of Seoul Industry Cooperation Foundation, Seoul (KR)

(72) Inventor: Hyeok Kim, Seoul (KR)

(73) Assignee: University of Seoul Industry Cooperation Foundation, Seoul (KR)

( * ) Notice: Subject to any disclaimer, the term of this patent is extended or adjusted under 35 U.S.C. 154(b) by 0 days.

(21) Appl. No.: 18/089,844

(22) Filed: Dec. 28, 2022

(65) Prior Publication Data
US 2023/0209846 A1   Jun. 29, 2023

(30) Foreign Application Priority Data
Dec. 28, 2021   (KR) .................... 10-2021-0190430

(51) Int. Cl.
*H10K 30/85* (2023.01)
*H10K 30/50* (2023.01)
(Continued)

(52) U.S. Cl.
CPC ............. *H10K 30/85* (2023.02); *H10K 30/50* (2023.02); *H10K 30/82* (2023.02); *H10K 30/86* (2023.02);
(Continued)

(58) Field of Classification Search
CPC ........ H10K 30/85; H10K 30/50; H10K 30/82; H10K 30/86; H10K 30/30; H10K 30/152;
(Continued)

(56) References Cited

U.S. PATENT DOCUMENTS

2021/0280719 A1 * 9/2021 Kim .................. H01L 29/78696

OTHER PUBLICATIONS

Kim,"Highly Efficient Inverted Polymer Solar Cells Using an Indium Gallium Zinc Oxide Interfacial Layer", Sol. RRL 2021, 5, 2000673, pp. 1-6. (Year: 2021).*
(Continued)

*Primary Examiner* — Devina Pillay
(74) *Attorney, Agent, or Firm* — NKL Law; Jae Youn Kim (57) ABSTRACT

Organic polymer semiconductor-based polymer solar cells (PSCs) have attracted considerable research interest due to having excellent electrical, structural, optical, mechanical, and chemical properties. In the past 20 years, considerable efforts have been made to develop PSCs. Generally, poly(3,4-ethylenedioxythiophene):poly(styrenesulfonate) (PEDOT:PSS) is used as a hole transport layer (HTL) of the PSC to enhance hole extraction efficiency, but highly acidic PEDOT:PSS destroys an indium tin oxide (ITO) electrode and an active layer and thus reduces the lifetime of the device. To avoid this problem, some attempts have been made to develop inverted PSCs having different electron transport layers (ETLs). However, such a device has limited power conversion efficiency (PCE) due to low electron mobility of the ETL. Therefore, attempts have been made to enhance the PCE of inverted PSCs using indium gallium zinc oxide (IGZO) having optimized indium (In), gallium (Ga), and zinc (Zn) contents. Accordingly, inverted PSCs that have ZnO or IGZO (having varying In:Ga:Zn molar ratios) as an ETL and have an ITO/ETL/PTB7:PC$_{71}$BM/MoO$_3$/Al structure have been constructed. The PCE of the inverted PSC can be increased from 6.22% to 8.72% using IGZO having an optimized weight ratio of In, Ga, and Zn.

3 Claims, 11 Drawing Sheets

(51) Int. Cl.
| | |
|---|---|
| H10K 30/82 | (2023.01) |
| H10K 30/86 | (2023.01) |
| H10K 71/15 | (2023.01) |
| H10K 85/10 | (2023.01) |
| H10K 85/20 | (2023.01) |
| H10K 102/10 | (2023.01) |
| H10K 102/20 | (2023.01) |

(52) U.S. Cl.
CPC ........... H10K 71/15 (2023.02); H10K 85/113 (2023.02); H10K 85/215 (2023.02); *H10K 2102/103* (2023.02); *H10K 2102/20* (2023.02)

(58) Field of Classification Search
CPC .... H10K 71/15; H10K 85/113; H10K 85/215; H10K 85/151; H10K 2102/103; H10K 2102/20; H10K 71/12; Y02E 10/549
See application file for complete search history.

(56) References Cited

OTHER PUBLICATIONS

Lee,"Blade-coated sol-gel indium-gallium-zinc-oxide for inverted polymer solar cell" AIP Advances 6, 115006 (2016), pp. 1-13 (Year: 2016).*
Chander,"Stability and Reliability of PTB7:PC71BM and PTB7:PC61BM Inverted Organic Solar Cells: A Comparative Study" IEEE Journal of Photovoltaics, vol. 9, No. 1, Jan. 2019, pp. 183-193 (Year: 2019).*
Azri,"Optical characterization of a-IGZO thin film for simulation of a-IGZO(n)/1-Si(p) heterojunction solar cell" Opt Quant Electron (2016) 48:391, pp. 1-16 (Year: 2016).*
C. C. Chen, L. Dou, J. Gao, W-H. Chang, G. Li, Y. Yang, Energy Environ. Sci. 2013, 6, 2714.
J. Y. Kim, S. Rhee, H. Lee, K. An, S. Biswas, Y. Lee, J. W. Shim, C. Lee, H. Kim, Adv. Mater. Interfaces 2020, 7, 1902003.
N. Zhou, A. S. Dudnik, T. I. Li, E. F. Manley, T. J. Aldrich, P. Guo, H.-C. Liao, Z. Chen, L. X. Chen, R. P. Chang, J. Am. Chem. Soc. 2016, 138, 1240.
T. Jia, J. Zhang, W. Zhong, Y. Liang, K. Zhang, S. Dong, L. Ying, F. Liu, X. Wang, F. Huang, Nano Energy 2020, 72, 104718.
Q. An, X. Ma, J. Gao, F. Zhang, Sci. Bull. 2019, 64, 504.
Y. Lin, B. Adilbekova, Y. Firdaus, E. Yengel, H. Faber, M. Sajjad, X. Zheng, E. Yarali, A. Seitkhan, O. M. Bakr, Adv. Mater. 2019, 31, 1902965.
W. Greenbank, N. Djeddaoui, E. Destouesse, J. Lamminaho, M. Prete, L. Boukezzi, T. Ebel, L. Bessissa, H. G. Rubahn, V. Turkovic, Energy Technol. 2020, 8, 2000295.
J. Cameron, P. J. Skabara, Mater. Horiz. 2020, 7, 1759.
S. Biswas, Y. J. You, J. Kim, S. R. Ha, H. Choi, S. H. Kwon, K. K. Kim, J. W. Shim, H. Kim, Appl. Surf. Sci. 2020, 512, 145700.
S. Biswas, Y. J. You, J. W. Shim, H. Kim, Thin Solid Films 2020, 700, 137921.
N. Chander, S. Singh, S. S. K. Iyer, Sol. Energy Mater. Sol. Cells 2017, 161, 407.
D. J. Lee, D. K. Heo, C. Yun, Y. H. Kim, M. H. Kang, ECS J. Solid State Sci. Technol. 2019, 8, Q32.
P. Vincent, D. K. Kim, J. H. Kwon, J. H. Bae, H. Kim, Thin Solid Films 2018, 660, 558.
M. Zafar, J. Y. Yun, D. H. Kim, Appl. Surf. Sci. 2017, 398, 9.
J. Chang, Z. Lin, C. Jiang, J. Zhang, C. Zhu, J. Wu, ACS Appl. Mater. Interfaces 2014, 6, 18861.
N. Zhou, X. Guo, R. P. Ortiz, S. Li, S. Zhang, R. P. H. Chang, A. Facchetti, T. J. Marks, Adv. Mater. 2012, 24, 2242.
S. A. Narayanasamy, R. Perumal, C. J. Choi, N. S. Arul, T. W. Kim, J. Ceram. Process. Res. 2014, 15, 347.
M. H. Chen, Y. C. Kuo, H. H. Lin, Y. P. Chao, M. S. Wong, J. Power Sources 2015, 275, 274.
T. Z. Oo, R. D. Chandra, N. Yantara, R. R. Prabhakar, L. H. Wong, N. Mathews, S. G. Mhaisalkar, Org. Electron. 2012, 13, 870.
A. Nirmal, A. K. K. Kyaw, X. Sun, H. V. Demir, J. Sol. Gel Sci. Technol. 2016, 78, 613.
M. Wu, S. Yu, L. He, G. Zhang, D. Ling, W. Zhang, Appl. Surf. Sci. 2014, 292, 219.
P. K. Nayak, T. Busani, E. Elamurugu, P. Barquinha, R. Martins, Y. Hong, E. Fortunato, Appl. Phys. Lett. 2010, 97,, 183504.
Y. H. Yang, S. S. Yang, C. Y. Kao, K.-S. Chou, IEEE Electron Device Lett. 2010, 31, 329.
J. H. Choi, S. M. Hwang, C. M. Lee, J. C. Kim, G. C. Park, J. Joo, J. H. Lim, J. Cryst. Growth 2011, 326,, 175.
G. H. Kim, W. H. Jeong, H. J. Kim, Phys. Status Solidi A 2010, 207, 1677.
T. Marimuthu, N. Anandhan, R. Thangamuthu, S. Surya, J. Alloys Compd. 2017, 693, 1011.
B. Cullity, Elements of X-Ray Diffraction, 2nd ed., Addison Wesley, Reading, MA, USA 1978.
Z. He, C. Zhong, S. Su, M. Xu, H. Wu, Y. Cao, Nat. Photonics 2012, 6, 591.
D. C. Lim, K. D. Kim, S. Y. Park, E. M. Hong, H. O. Seo, J. H. Lim, K. H. Lee, Y. Jeong, C. Song, E. Lee, Y. D. Kim, S. Cho, Energy Environ. Sci. 2012, 5, 9803.
T. Yang, M. Wang, C. Duan, X. Hu, L. Huang, J. Peng, F. Huang, X. Gong, Energy Environ. Sci. 2012, 5, 8208.
S. Hamwi, J. Meyer, T. Winkler, T. Riedl, W. Kowalsky, Appl. Phys. Lett. 2009, 94, 253307.
J. Meyer, A. Kahn, J. Photonics. Energy 2011, 1, 011109.
R. T. White, E. S. Thibau, Z. H. Lu, Sci. Rep 2016, 6, 21109.
J. Meyer, S. Hamwi, M. Kroger, W. Kowalsky, T. Riedl, A. Kahn, Adv. Mater. 2012, 24, 5408.

\* cited by examiner

HIGHLY EFFICIENT INVERTED POLYMER SOLAR CELLS USING AN INDIUM GALLIUM ZINC OXIDE INTERFACIAL LAYER

BACKGROUND

1. Field of the Invention

The present invention relates to a polymer solar cell. Specifically, the present invention relates to an inverted polymer solar cell having a structure of transparent electrode/electron transport layer/active layer/hole transport layer/metal electrode.

2. Discussion of Related Art

Organic polymer semiconductor-based polymer solar cells (PSCs) have attracted considerable attention due to having cost efficiency, mechanical flexibility, a large area, and room-temperature processability in the past 10 years. The light energy harvesting (power conversion efficiency (PCE)) of PSCs has been continuously improved in the past 10 years and currently stands at 17%. The PSCs generally have two types of structures. The most common structure is a structure of indium tin oxide (ITO) as a transparent electrode/poly(3,4-ethylenedioxythiophene):poly(styrenesulfonate) (PEDOT:PSS) as a hole transport layer (HTL)/a photoactive layer/an electron transport layer (ETL)/a (calcium (Ca) or barium (Ba)) metal electrode. However, highly acidic PEDOT:PSS may destroy the ITO layer and degrade device stability.

Various approaches for overcoming the problems associated with the conventional structure have been applied. Some researchers have attempted to replace PEDOT:PSS with other p-type semiconductors. An inverted structure of ITO/ETL/active material/hole transport layer/metal electrode (gold (Au) or silver (Ag)) has also been tested.

For excellent overall performance, inverted PSCs (IPSCs) need to have an ETL having high carrier mobility, excellent transparency, and excellent energy level matching with other layers. Generally, researchers have used a metal oxide such as ZnO or $TiO_2$ as an ETL of the IPSC. Among metal oxides, ZnO has high transmittance, excellent electrical transportability, environmental stability, excellent hole blocking properties, and low costs.

In order to improve the charge transport properties of IPSCs, various metal-doped n-type semiconductors have recently been used as a buffer layer (ETL). In this case, single metal-doped semiconductors, such as aluminum (Al)-doped zinc oxide, gallium (Ga)-doped zinc oxide, tin (Sn)-doped zinc oxide, indium (In)-doped zinc oxide, and niobium (Nb)-doped zinc oxide (NZO), have been used.

In- and Ga-doped ZnO (IGZO) is attracting attention due to having a wide bandgap, excellent electron mobility, high carrier concentration, and excellent light transmittance, and is used in inorganic thin film transistors (TFTs).

IGZO has several disadvantages such as complex deposition techniques, low-temperature processing, and a molar ratio of In, Ga, and Zn. The relative molar ratio of In, Ga, and Zn is important for controlling the properties of IGZO. Indium (In) supplies free electrons to improve the mobility of IGZO, and Gallium (Ga) forms oxygen vacancies inside IGZO to reduce the generation of charge carriers. Although IGZO exhibits excellent performance when used as an active material of an inorganic thin film and is attracting attention, it has not been used in PSCs.

RELATED-ART DOCUMENTS

Non-Patent Documents

[1] C. C. Chen, L. Dou, J. Gao, W-H. Chang, G. Li, Y. Yang, Energy Environ. Sci. 2013, 6, 2714.

[2] J. Y. Kim, S. Rhee, H. Lee, K. An, S. Biswas, Y. Lee, J. W. Shim, C. Lee, H. Kim, Adv. Mater. Interfaces 2020, 7, 1902003.

[3] N. Zhou, A. S. Dudnik, T. I. Li, E. F. Manley, T. J. Aldrich, P. Guo, H.-C. Liao, Z. Chen, L. X. Chen, R. P. Chang, J. Am. Chem. Soc. 2016, 138, 1240.

[4] T. Jia, J. Zhang, W. Zhong, Y. Liang, K. Zhang, S. Dong, L. Ying, F. Liu, X. Wang, F. Huang, Nano Energy 2020, 72, 104718.

[5] Q. An, X. Ma, J. Gao, F. Zhang, Sci. Bull. 2019, 64, 504.

[6] Y. Lin, B. Adilbekova, Y. Firdaus, E. Yengel, H. Faber, M. Sajjad, X. Zheng, E. Yarali, A. Seitkhan, O. M. Bakr, Adv. Mater. 2019, 31, 1902965.

[7] W. Greenbank, N. Djeddaoui, E. Destouesse, J. Lamminaho, M. Prete, L. Boukezzi, T. Ebel, L. Bessissa, H. G. Rubahn, V. Turkovic, Energy Technol. 2020, 8, 2000295.

[8] J. Cameron, P. J. Skabara, Mater. Horiz. 2020, 7, 1759.

[9] S. Biswas, Y. J. You, J. Kim, S. R. Ha, H. Choi, S. H. Kwon, K. K. Kim, J. W. Shim, H. Kim, Appl. Surf. Sci. 2020, 512, 145700.

[10] S. Biswas, Y. J. You, J. W. Shim, H. Kim, Thin Solid Films 2020, 700, 137921.

[11] N. Chander, S. Singh, S. S. K. Iyer, Sol. Energy Mater. Sol. Cells 2017, 161, 407.

[12] D. J. Lee, D. K. Heo, C. Yun, Y. H. Kim, M. H. Kang, ECS J. Solid State Sci. Technol. 2019, 8, Q32.

[13] P. Vincent, D. K. Kim, J. H. Kwon, J. H. Bae, H. Kim, Thin Solid Films 2018, 660, 558.

[14] M. Zafar, J. Y. Yun, D. H. Kim, Appl. Surf. Sci. 2017, 398, 9.

[15] J. Chang, Z. Lin, C. Jiang, J. Zhang, C. Zhu, J. Wu, ACS Appl. Mater. Interfaces 2014, 6, 18861.

[16] N. Zhou, X. Guo, R. P. Ortiz, S. Li, S. Zhang, R. P. H. Chang, A. Facchetti, T. J. Marks, Adv. Mater. 2012, 24, 2242.

[17] S. A. Narayanasamy, R. Perumal, C. J. Choi, N. S. Arul, T. W. Kim, J. Ceram. Process. Res. 2014, 15, 347.

[18] M. H. Chen, Y. C. Kuo, H. H. Lin, Y. P. Chao, M. S. Wong, J. Power Sources 2015, 275, 274.

[19] T. Z. Oo, R. D. Chandra, N. Yantara, R. R. Prabhakar, L. H. Wong, N. Mathews, S. G. Mhaisalkar, Org. Electron. 2012, 13, 870.

[20] A. Nirmal, A. K. K. Kyaw, X. Sun, H. V. Demir, J. Sol. Gel Sci. Technol. 2016, 78, 613.

[21] M. Wu, S. Yu, L. He, G. Zhang, D. Ling, W. Zhang, Appl. Surf. Sci. 2014, 292, 219.

[22] P. K. Nayak, T. Busani, E. Elamurugu, P. Barquinha, R. Martins, Y. Hong, E. Fortunato, Appl. Phys. Lett. 2010, 97, 183504.

[23] Y. H. Yang, S. S. Yang, C. Y. Kao, K.-S. Chou, IEEE Electron Device Lett. 2010, 31, 329.

[24] J. H. Choi, S. M. Hwang, C. M. Lee, J. C. Kim, G. C. Park, J. Joo, J. H. Lim, J. Cryst. Growth 2011, 326, 175.

[25] G. H. Kim, W. H. Jeong, H. J. Kim, Phys. Status Solidi A 2010, 207, 1677.

[26] T. Marimuthu, N. Anandhan, R. Thangamuthu, S. Surya, J. Alloys Compd. 2017, 693, 1011.

[27] B. Cullity, Elements of X-Ray Diffraction, 2nd ed., Addison Wesley, Reading, MA, USA 1978.

[28] Z. He, C. Zhong, S. Su, M. Xu, H. Wu, Y. Cao, Nat. Photonics 2012, 6, 591.

[29] D. C. Lim, K. D. Kim, S. Y. Park, E. M. Hong, H. O. Seo, J. H. Lim, K. H. Lee, Y. Jeong, C. Song, E. Lee, Y. D. Kim, S. Cho, Energy Environ. Sci. 2012, 5, 9803.

[30] T. Yang, M. Wang, C. Duan, X. Hu, L. Huang, J. Peng, F. Huang, X. Gong, Energy Environ. Sci. 2012, 5, 8208.

[31] S. Hamwi, J. Meyer, T. Winkler, T. Riedl, W. Kowalsky, Appl. Phys. Lett. 2009, 94, 253307.

[32] J. Meyer, A. Kahn, J. Photonics. Energy 2011, 1, 011109.

[33] R. T. White, E. S. Thibau, Z. H. Lu, Sci. Rep 2016, 6, 21109.

[34] J. Meyer, S. Hamwi, M. Kroger, W. Kowalsky, T. Riedl, A. Kahn, Adv. Mater. 2012, 24, 5408.

SUMMARY OF THE INVENTION

The present invention is directed to providing a solar cell structure having enhanced device stability and high power conversion efficiency.

In order to solve the problems of the related art, the present invention discloses an inverted polymer solar cell which has an inverted structure in which a transparent electrode, an electron transport layer (ETL), a photoactive layer, a hole transport layer (HTL), and a metal electrode are sequentially laminated and uses indium (In)- and gallium (Ga)-doped zinc oxide (ZnO) as the electron transport layer (ETL).

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Terms used in this specification will be briefly described, and embodiments of the present invention will be described in detail. The terms used in this specification have been selected from general terms that are currently widely used as much as possible while considering the functions in the present invention, but they may vary depending on the intention of a person skilled in the art, a precedent, the emergence of new technologies, or the like. In addition, there is also a term arbitrarily selected by the applicant in a specific case, and in this case, the meaning thereof will be described in detail in the description of the invention. Therefore, the terms used in this specification should be defined based on the meaning of the term and the overall content of the present invention, not simply the name of the term.

Hereinafter, exemplary embodiments of the present invention will be described in detail with reference to the accompanying drawings.

Organic polymer semiconductor-based polymer solar cells (PSCs) have attracted considerable attention due to having cost efficiency, mechanical flexibility, a large area, and room-temperature processability in the past 10 years. The light energy harvesting (power conversion efficiency (PCE)) of PSCs has been continuously improved in the past 10 years and currently stands at 17%. The PSCs generally have two types of structures. The most common structure is a structure of indium tin oxide (ITO) as a transparent electrode/poly(3,4-ethylenedioxythiophene):poly(styrenesulfonate) (PEDOT:PSS) as a hole transport layer (HTL)/a photoactive layer/an electron transport layer (ETL)/a (calcium (Ca) or barium (Ba)) metal electrode. However, highly acidic PEDOT:PSS may destroy the ITO layer and degrade device stability.

Various approaches for overcoming the problems associated with the conventional structure have been applied. Some researchers have attempted to replace PEDOT:PSS with other p-type semiconductors. An inverted structure of ITO/ETL/active material/hole transport layer/metal electrode (gold (Au) or silver (Ag)) has also been tested.

For excellent overall performance, inverted PSCs (IPSCs) need to have an ETL having high carrier mobility, excellent transparency, and excellent energy level matching with other layers. Generally, researchers have used a metal oxide such as ZnO or $TiO_2$ as an ETL of the IPSC. Among metal oxides, ZnO has high transmittance, excellent electrical transportability, environmental stability, excellent hole blocking properties, and low costs.

In order to improve the charge transport properties of IPSCs, various metal-doped n-type semiconductors have recently been used as a buffer layer (ETL). In this case, single metal-doped semiconductors, such as aluminum (Al)-doped zinc oxide, gallium (Ga)-doped zinc oxide, tin (Sn)-doped zinc oxide, indium (In)-doped zinc oxide, and niobium (Nb)-doped zinc oxide (NZO), have been used.

In- and Ga-doped ZnO (IGZO) is attracting attention due to having a wide bandgap, excellent electron mobility, high carrier concentration, and excellent light transmittance, and is used in inorganic thin film transistors (TFTs).

IGZO has several disadvantages such as complex deposition technique, low-temperature processing, and a molar ratio of In, Ga, and Zn. The relative molar ratio of In, Ga, and Zn is important for controlling the properties of IGZO. Indium (In) supplies free electrons to improve the mobility of IGZO, and Gallium (Ga) forms oxygen vacancies inside IGZO to reduce the generation of charge carriers. Although IGZO exhibits excellent performance when used as an active material of an inorganic thin film and is attracting attention, it has not been used in PSCs.

Therefore, the inventors of the present invention have studied the effect of Zn concentration on the behavior of an IGZO film (solution-treated) as an ETL of an IPSC.

In a device, thieno[3,4-b]-thiophene/benzodithiophene (PTB7):[6,6]-phenyl $C_{71}$-butyric acid methyl ester ($PC_{71}BM$) was used as a photoactive material. The IGZO film significantly improved the PCE of the device from 6.22% to 8.72%.

[Experiment Results]

Figure 1:
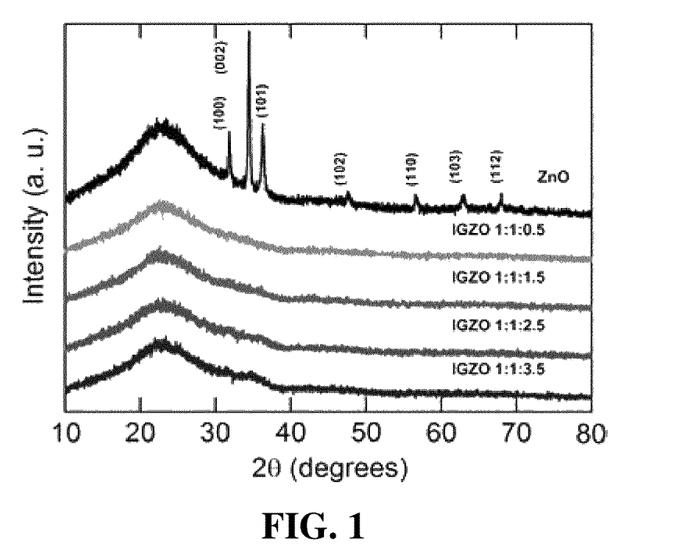
FIG. 1 shows X-ray diffraction (XRD) profiles of undoped ZnO and IGZO films.
Figure 2A:
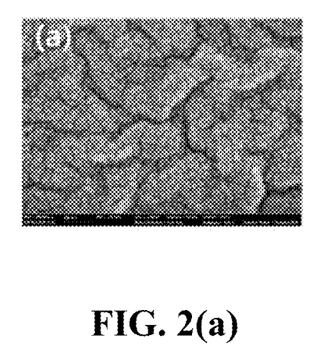
FIGS. 2(a)-2(e) show field emission scanning electron microscope (FESEM) micrograms of films formed of ZnO and IGZO.
Figure 2B:
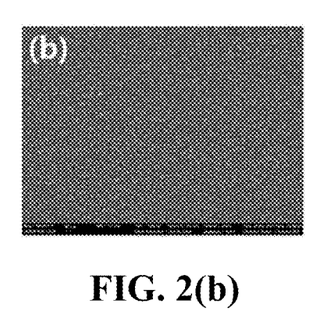
Figure 2C:
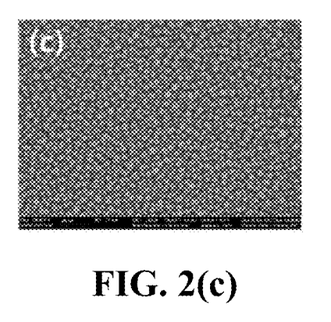
Figure 2D:
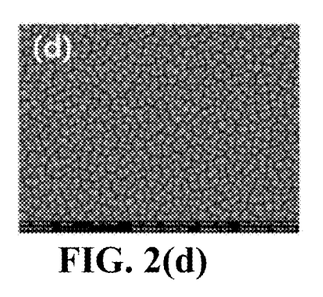
Figure 2E:
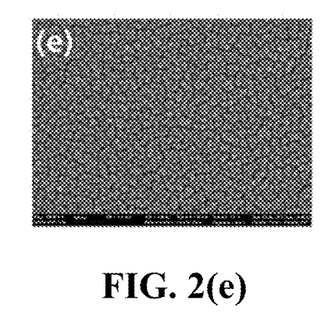
Figure 3A:
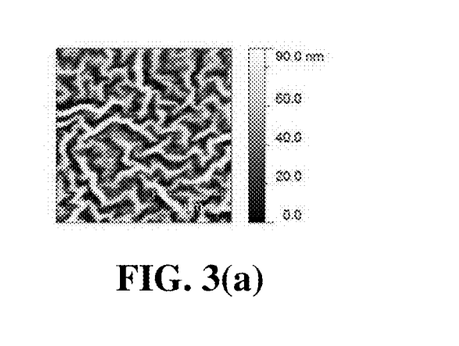
FIGS. 3(a)-3(e) show atomic force microscope (AFM) micrograms of different films formed of ZnO and IGZO.
Figure 3B:
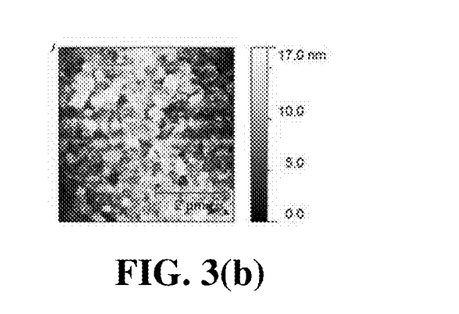
Figure 3C:
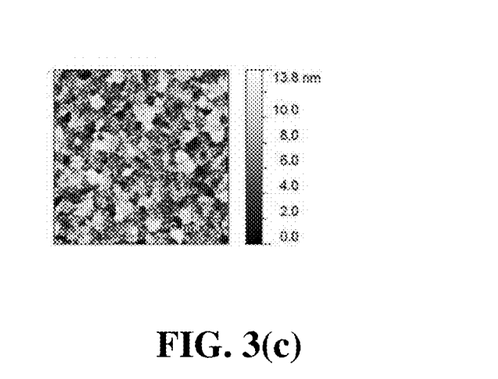
Figure 3D:
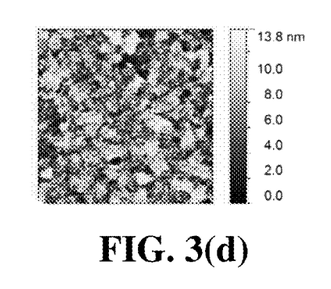
Figure 3E:
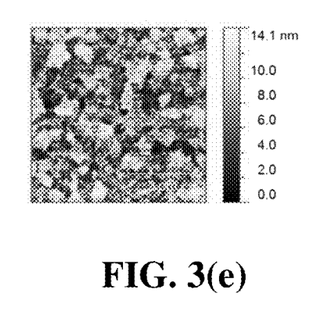

FIG. 1 shows X-ray diffraction (XRD) profiles of undoped ZnO and IGZO (having varying Zn concentrations) films. The XRD profile of ZnO exhibited distinct peaks around 31.77°, 34.40°, 36.26°, 47.51°, 56.55°, 62.79°, and 67.89° which are basically associated with the (100), (002), (102), (10), (10), (103), (103), and (112) planes of the hexagonal wurtzite structure of ZnO (lattice constant a=3.248 Å and c=5.207 Å). From the XRD profile, the size of ZnO nanoparticles was calculated using the Scherrer equation. The particle size was estimated to be about 22 nm. From the XRD profiles (FIG. 1) of various IGZO films, the amorphous nature of the films was confirmed.

The surface morphology (roughness) of several layers of a photovoltaic device significantly affects the performance level. Therefore, the inventors of the present invention attempted to visualize the surface morphology of different films formed of ZnO and IGZO (having varying In:Ga:Zn weight ratios) through atomic force microscope (AFM) images and field emission scanning electron microscope (FESEM) images. FIGS. 2(a)-2(e) show FESEM micrograms of films formed of ZnO and IGZO. In the FESEM micrograms of IGZO films, it could be observed that small particles were uniformly distributed.

FIGS. 3(a) to 3(e) show the AFM micrograms of different films formed of ZnO and IGZO. In the AFM micrograms, the root mean square (RMS) value of surface roughness was 14.91 nm for ZnO and 2.18 nm, 1.53 nm, 1.48 nm, and 1.61 nm for IGZO (having varying In:Ga:Zn molar ratios of 1:1:0.5, 1:1:1.5, 1:1:2.5, and 1:1:3.5, respectively). As a result of observing the FESEM and AFM images of different films, it was confirmed that the film formed of IGZO had a smoother surface than the ZnO film.

Therefore, it is expected that a smoother ETL will result in good contact between IGZO and the $PTB7:PC_{71}BM$ layer and better electron collection efficiency of the solar cell.

Figure 4A:
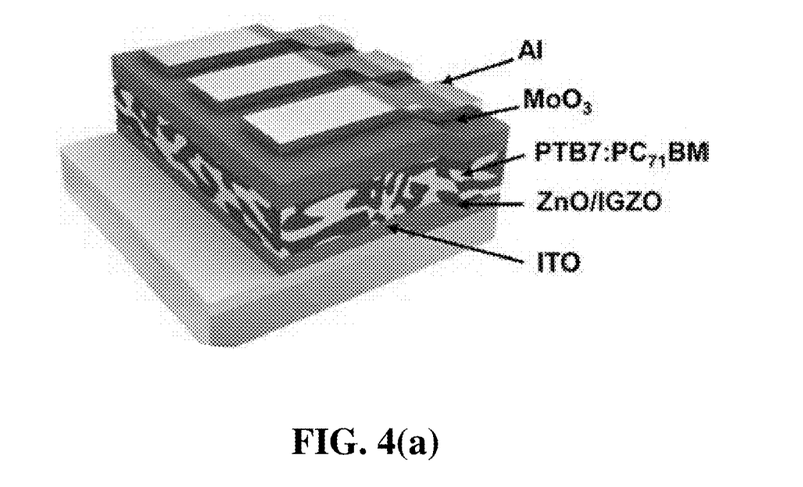
FIGS. 4(a) and 4(b) show a schematic diagram of an IPSC and an energy level diagram of constituent materials.
Figure 4B:
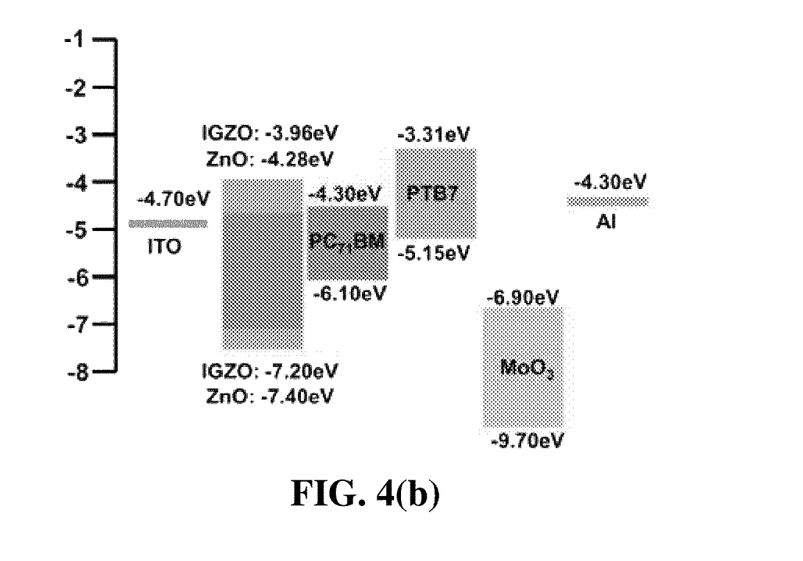

In order to confirm the potential of films formed of IGZO (having varying In, Ga, and Zn concentrations) as an ETL of an inverted PSC, inverted PSCs (IPSCs) having ETLs formed of ZnO or IGZO (having varying In, Ga, and Zn concentrations) were manufactured. The schematic diagram of IPSCs and the energy level diagram of constituent materials are shown in FIGS. 4(a) and 4(b). The PSC consists of ITO/ZnO or $IGZO/PTB7:PC_{71}BM/MoO_3/Al$.

Figure 5:
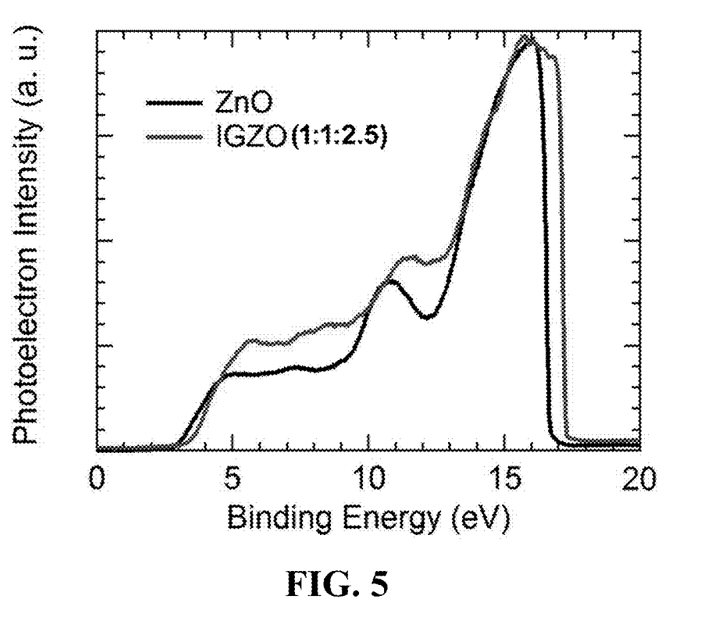
FIG. 5 shows ultraviolet photoelectron spectroscopy (UPS) spectra of respective samples formed of undoped ZnO and IGZO.

Next, work function (WF) values of films were estimated from the ultraviolet photoelectron spectroscopy (UPS) spectra (see FIG. 5) of respective samples formed of undoped ZnO and IGZO (In:Ga:Zn=1:1:2.5) (−4.45 eV and −4.00 eV, respectively) using Equation 1. In Equation 1, $hv$ is 21.2 eV for HeI, and $E_{SE}$ is the secondary edge position of the UPS spectrum.

$$WF = (hv - E_{SE}) \quad \text{[Equation 1]}$$

Next, ionization energy (IE) values of ZnO and IGZO (In:Ga:Zn=1:1:2.5) were estimated from the UPS spectrum of each sample using Equation 2. In Equation 2, W is the width of the UPS spectrum.

$$IE = hv - W \quad \text{[Equation 2]}$$

Figure 6:
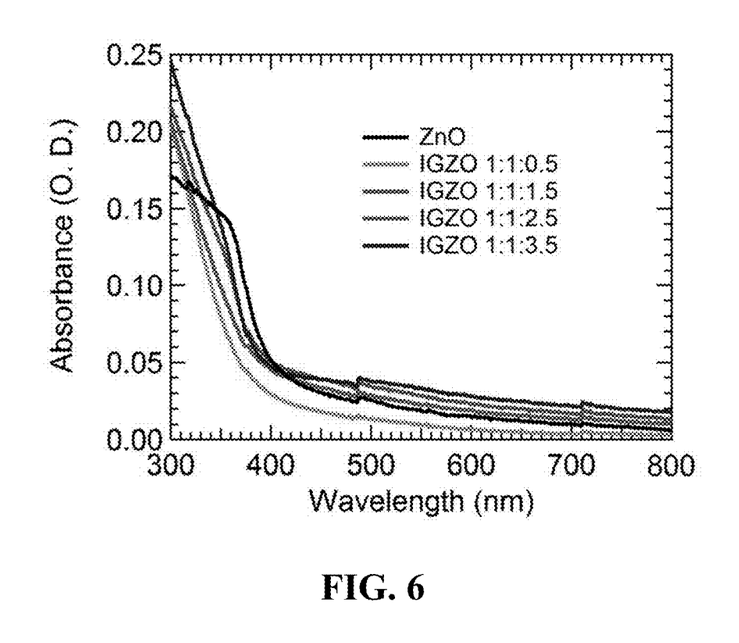
FIG. 6 shows ultraviolet (UV) absorption spectra of respective samples formed of undoped ZnO and IGZO.

The estimated IE values of ZnO and IGZO (In:Ga:Zn=1:1:2.5) are −7.4 eV and −7.2 eV, respectively. Next, the optical bandgaps ($E_g$s) of various materials were calculated by analyzing the ultraviolet (UV) absorption spectra (see FIG. 6). Referring to FIG. 6, it can be seen that the edge of the absorption spectrum of ZnO has shifted toward the blue region, and the $E_g$ of ZnO is increased from 3.12 eV to 3.24 eV (In:Ga:Zn=1:1:2.5) due to doping. Basically, this type of blue shift of the edge of absorption spectrum of ZnO by doping is due to the enhancement of charge carrier concentration, which blocks the lowest state (filled state) in the conduction band (Burstein-Moss effect).

Next, electron affinity (EA) values of ZnO and IGZO were calculated by subtracting $E_g$ from the IE values of corresponding samples. The estimated EA values of ZnO and IGZO are −4.28 eV and −3.96 eV, respectively. In the IPSC, after illumination, the active layer ($PTB7:PC_{71}BM$) of the solar cell absorbs photon energy and generates excitons (electron and hole pairs). Afterward, the excitons diffuse and dissociate at the interface of $PTB7:PC_{71}BM$. Then, the separated electrons move toward the ETL (ZnO or IGZO) and then move toward the ITO electrode. On the other hand, holes move toward the HTL ($MoO_3$) and are collected by the Al electrode.

The energy of the lowest unoccupied molecular orbital (LUMO) of the ETL is very similar to the energy of the LUMO of $PC_{71}BM$ (−4.30 eV). Also, the energy of the highest occupied molecular orbital (HOMO) of the HTL (−6.90 eV) is very close to the energy of the HOMO of PTB7 (−5.15 eV). This facilitates the movement of electrons toward the ITO electrode. On the other hand, the movement of holes toward the ITO electrode is blocked due to a difference between the HOMO levels of the ETL (ZnO or IGZO) and PTB7. Also, the movement of electrons toward the Al electrode is blocked due to a difference between the LOMO levels of the HTL ($MoO_3$) and $PC_{71}BM$.

Figure 7A:
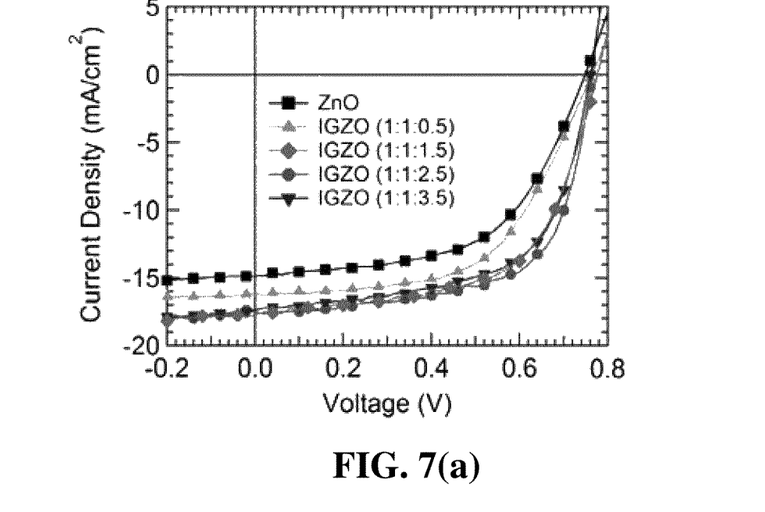
FIGS. 7(a)-7(c) show the change in current density (J) according to voltage (V) of each IPSC and an IPCE spectrum thereof.

FIG. 7(a) shows the change in current density (J) according to voltage (V) of each IPSC manufactured using undoped ZnO and IGZO having varying Zn concentrations. The devices were tested under 1 sun condition (100 $mWcm^{-2}$ and AM1.5 G light). All the devices were studied and measured 3 to 4 times. Table 1 shows the best performance measurement values of each solar cell.

TABLE 1

| Items | ZnO | IGZO [1:1:0.5] | IGZO [1:1:1.5] | IGZO [1:1:2.5] | IGZO [1:1:3.5] |
|---|---|---|---|---|---|
| $J_{SC}$ [mA $cm^{-2}$] | 14.83 | 16.12 | 17.71 | 17.47 | 17.34 |
| $V_{OC}$ [V] | 0.75 | 0.76 | 0.77 | 0.76 | 0.76 |
| FF [%] | 56.12 | 57.22 | 59.93 | 65.36 | 61.53 |
| PCE [%] | 6.22 | 7.04 | 8.23 | 8.72 | 8.11 |
| $R_S$ [Ω $cm^2$] | 14.15 | 13.41 | 5.04 | 1.92 | 2.90 |
| $R_{Sh}$ [Ω $cm^2$] | 284.96 | 536.37 | 808.41 | 1411.35 | 1090.75 |

The J-V characteristics and performance measurement values of all the measured PSCs are shown in FIGS. 8(a)-8(e) and Table 2.

TABLE 2

|  | $J_{SC}$ (mA/$cm^2$) | $V_{OC}$ (V) | FF (%) | PCE (%) |
|---|---|---|---|---|
| ZnO #1 | 14.13 | 0.74 | 50.44 | 5.31 |
| ZnO #2 | 14.42 | 0.75 | 58.53 | 6.35 |
| ZnO #3 | 14.84 | 0.75 | 56.12 | 6.22 |
| IGZO (1:1:0.5) #1 | 16.25 | 0.76 | 56.36 | 6.98 |
| IGZO (1:1:0.5) #2 | 15.97 | 0.77 | 54.75 | 6.77 |
| IGZO (1:1:0.5) #3 | 16.37 | 0.76 | 51.93 | 6.49 |
| IGZO (1:1:0.5) #4 | 16.12 | 0.76 | 57.22 | 7.04 |
| IGZO (1:1:1.5) #1 | 17.35 | 0.77 | 60.22 | 8.07 |
| IGZO (1:1:1.5) #2 | 17.33 | 0.77 | 60.06 | 8.07 |

TABLE 2-continued

| | $J_{SC}$ (mA/cm$^2$) | $V_{OC}$ (V) | FF (%) | PCE (%) |
|---|---|---|---|---|
| IGZO (1:1:1.5) #3 | 18.07 | 0.77 | 58.83 | 8.17 |
| IGZO (1:1:1.5) #4 | 17.71 | 0.77 | 59.92 | 8.23 |
| IGZO (1:1:2.5) #1 | 17.07 | 0.77 | 64.65 | 8.48 |
| IGZO (1:1:2.5) #2 | 17.41 | 0.77 | 63.40 | 8.51 |
| IGZO (1:1:2.5) #3 | 17.45 | 0.76 | 62.59 | 8.35 |
| IGZO (1:1:2.5) #4 | 17.47 | 0.76 | 65.36 | 8.72 |
| IGZO (1:1:3.5) #1 | 17.04 | 0.76 | 62.21 | 8.07 |
| IGZO (1:1:3.5) #2 | 17.32 | 0.76 | 61.31 | 8.08 |
| IGZO (1:1:3.5) #3 | 17.34 | 0.76 | 61.53 | 8.11 |

Referring to Table 1, it can be seen that the short-circuit current density ($J_{SC}$), open-circuit voltage ($V_{OC}$), fill factor (FF), and PCE value of the solar cell having ZnO as an ETL are 14.83 mAcm$^{-2}$, 0.75 V, 56.12%, and 6.22%, respectively. On the other hand, it can be seen that the overall performance level of the inverted solar cell having IGZO as an ETL is better than that of the ZnO-based device.

In addition, it can be seen that the performance level of the device strongly depends on the molar ratio of In, Ga, and Zn in the IGZO layer (ETL), and outstanding performance levels ($J_{SC}$=17.47 mAcm$^{-2}$, $V_{OC}$=0.76 V, FF=65.36%, and PCE=8.72%) were exhibited in the device having an ETL molar ratio of 1:1:2.5. Also, when a larger amount of Zn was used (In:Ga:Zn molar ratio=1:1:3.5), some reduction in PCE (8.11%) can be observed.

Figure 7B:
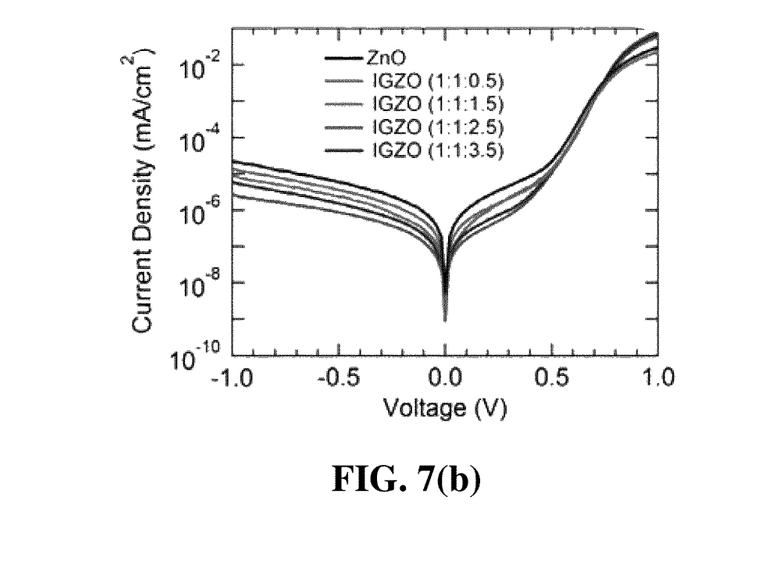

In Table 1, it can be seen that the solar cell having ZnO as an ETL has a series resistance ($R_S$) of 14.15 Ωcm$^2$ and a shunt resistance ($R_{Sh}$) of 284.96 Ωcm$^2$, but the IGZO (1:1:2.5) ETL-based solar cell has a very small $R_S$ (1.92 Ωcm$^2$) and a very high $R_{Sh}$ (1411.35 Ωcm$^2$). From the significant $R_S$ decrease and the significant $R_{Sh}$ increase, it can be seen that the highest $J_{SC}$, FF, and PCE value of the IGZO (1:1:2.5) ETL-based device result in high electron collection efficiency and low leakage current. Also, the J-V characteristics (dark condition) (see FIG. 7(b)) show that the IGZO (1:1:2.5) ETL-based solar cell is capable of exhibiting excellent diode characteristics (under reverse bias) due to the combined effect of low resistivity, the smoothest surface, and high charge carrier concentration, as compared to the solar cells based on ZnO and IGZO having other Zn concentrations.

Figure 7C:
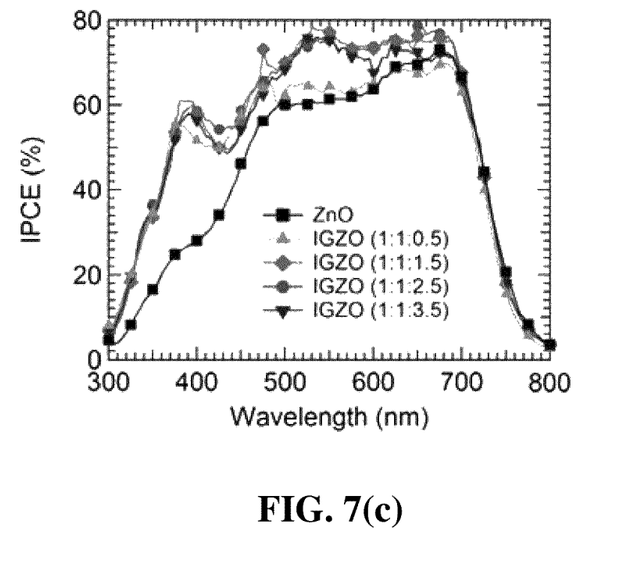
Figure 8A:
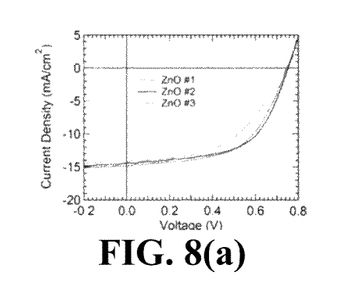
FIGS. 8(a)-8(e) show the J-V characteristics of all the PSCs used in measurement.
Figure 8B:
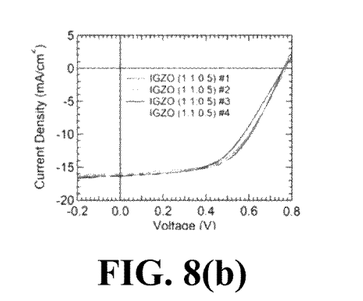
Figure 8C:
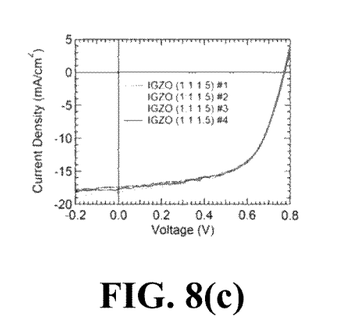
Figure 8D:
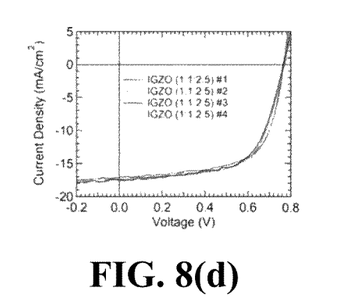
Figure 8E:
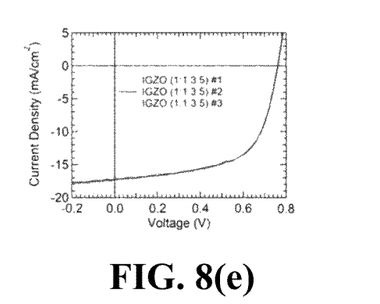

In IGZO, In serves to supply free electrons. The s-orbital of In$^{3+}$ ions is larger than the s-orbital of Zn$^{2+}$ ions. Therefore, a decrease in the Zn concentration in IGZO is capable of increasing the carrier mobility of the semiconductor by improving the direct overlapping of the s-orbitals of adjacent In$^{3+}$ ions. On the other hand, when an amount of Ga is not optimized, oxygen vacancies are formed, and thus the generation of charge carriers may be suppressed. A high concentration of oxygen vacancies in the IGZO compound may interfere with the charge transport mechanism due to the scattering effect of oxygen-related defects. For this reason, optimization of a molar ratio of In, Ga, and Zn in IGZO (in this example, In:Ga:Zn=1:1:2.5) is very important for achieving low resistivity. FIG. 7(c) shows wavelength-dependent IPCE values of various solar cells. From FIG. 7(c), it can be seen that the IPCE value of the solar cell having IGZO (molar ratio=1:1:2.5) as an ETL was higher than that of the undoped ZnO (ETL)-based solar cell.

In addition, the solar cell having undoped ZnO as an ETL exhibited a $J_{SC}$ value (calculated from the IPCE spectrum of each device) of about 14.62 mAcm$^{-2}$, and the IGZO solar cells having molar ratios of 1:1:0.5, 1:1:1.5, 1:1:2.5, and 1:1:3.5 exhibited a $J_{SC}$ value of 15.69, 17.29, 17.35, and 16.76 mAcm$^{-2}$, respectively. These calculated values are very similar to the $J_{SC}$ values estimated from the current density (J)-voltage (V) curve (see Table 1).

Conclusion

Highly efficient inverted PSCs were manufactured using IGZO as an ETL. First, IGZO films having varying In:Ga:Zn weight ratios were formed on ITO-coated substrates. All the IGZO films thus formed were found to be amorphous in nature. The surface of the IGZO films was significantly smoother than the film formed of ZnO.

Next, the potential of the IGZO film which is the ETL of the inverted PSC was tested. It was observed that the PCE value of the amorphous IGZO-based PSC was better than that of the crystalline ZnO-based PSC. Also, the PCE value of the PSC was significantly enhanced by optimizing the weight ratio of constituent materials of IGZO. The optimized weight ratio of In, Ga, and Zn enhanced electron extraction efficiency in the PSC and reduced internal leakage current due to the low resistivity, surface roughness, and high charge carrier concentration of the IGZO film. The PSC having IGZO (1:1:2.5) as an ETL exhibited the highest PCE value of 8.72%.

Experiment

Preparation of IGZO thin film: An IGZO thin film was deposited through a simple sol-gel spin coating technique. First, indium (III) nitrate hydrate (In(NO$_3$)$_3$·xH$_2$O) (0.1 M), gallium (III) nitrate hydrate (Ga(NO$_3$)$_3$·xH$_2$O) (0.1 M), and zinc acetate dihydrate (Zn(CH$_3$COO)$_2$·2H$_2$O) (0.05, 0.15, 0.25, and 0.35 M) were dissolved in a mixed solution of ethanol (C$_2$H$_5$OH) and ethanolamine (NH$_2$CH$_2$CH$_2$OH). In this case, the temperature of the resulting mixture was fixed at room temperature.

Four batches of IGZO:solution mixtures with four different In:Ga:Zn molar ratios (1:1:0.5, 1:1:1.5, 1:1:2.5, and 1:1:3.5) were prepared. Then, the solution was stirred for 3 hours to prepare a homogeneous, clear, and transparent solution.

Next, the varying solutions were applied onto ITO-coated substrates (cleaned) through spin coating and annealed at 450° C. for 2 hours. Finally, an IGZO thin film was formed.

Manufacture and characterization of device: The designed inverted PSC has an ITO/IGZO/PTB7:PC$_{71}$BM/MoO$_3$/Al structure. In order to manufacture a solar cell, first, an ITO-coated (patterned) substrate was cleaned with isopropyl alcohol, acetone, and deionized (DI) water each for 15 minutes through ultrasonication. Afterward, a 30 nm-thick IGZO layer was formed on the cleaned ITO-coated substrate through spin coating. Then, the IGZO film was annealed (in air) on a hot plate at 450° C. for 2 hours. The substrate was transferred to a nitrogen-filled glove box, and adequate amounts of PTB7 and PC$_{71}$BM were mixed in a mixture (97:3 vol %) of chlorobenzene and 1,8-diiodooctane to prepare a PTB7:PC$_{71}$BM (weight ratio=1:1.5) solution.

Afterward, an active layer (70 nm) was formed on the IGZO layer through spin coating with PTB7:PC$_{71}$BM. The active layer was slowly dried, and 10 nm-thick MoO$_3$ and 100 nm-thick Al were sequentially deposited on the active layer of the device through thermal evaporation under a pressure of about 10$^{-6}$ Torr. The area of the active layer of the device was 1.96 mm$^2$.

The XRD patterns of various samples were recorded using a New D8 Advance X-ray diffractometer. The morphology of each film was observed by a Zeiss Supra 55VP FESEM. The surface topology of each film was observed by an XE-100 AFM (Park Systems Corporation). The UPS measurement of each film was performed by an AXIS Ultra DLD (KRATOS Inc.), and the light source was HeI (21.2 eV). The absorbance spectrum of each sample was recorded using a Beckman DU-70 spectrophotometer. The change in current density (J) according to voltage (V) (dark and 1 sun conditions) of each solar cell was measured by a source meter (Keithley 237). For illumination, a Newport 91160 A (AM1.5 G with a KG 5 filter) 300 W solar simulator was used. The wavelength-dependent incident photon to charge carrier efficiency (IPCE) of each solar cell was recorded by a lock-in amplifier (Model: 7265, Signal Recovery Corporation). For illumination (monochromatic light) purposes, a SpectroPro-150 (Acton Research Corporation) xenon lamp was used through a monochromator.

According to the present invention, device stability can be enhanced by replacing a highly acidic material conventionally used in a solar cell.

In addition, according to the present invention, an inverted polymer solar cell having high power conversion efficiency can be manufactured.

The above-described exemplary embodiments of the present invention have been described for illustrative purposes, those skilled in the art will be able to make various modifications, changes, and additions within the spirit and scope of the present invention, and the modifications, changes, and additions will be considered to be included in the scope of the appended claims.

Since various substitutions, modifications, and changes can be made by those skilled in the art to which the present invention pertains without departing from the technical spirit of the present invention, the present invention is not limited by the above-described embodiments and the accompanying drawings.

What is claimed is:

1. An inverted polymer solar cell (IPSC) in which a transparent electrode, an electron transport layer (ETL), a photoactive layer, a hole transport layer (HTL), and a metal electrode are sequentially laminated, wherein the electron transport layer (ETL) is made of indium (In)- and gallium (Ga)-doped zinc oxide (ZnO), wherein a molar ratio of indium (In), gallium (Ga), and zinc (Zn) in the electron transport layer (ETL) is 1:1:2.5, and wherein the ETL has a series resistance of about 1.92 Ω $cm^2$ and a shunt resistance of about 1411.35 Ω $cm^2$.

2. The inverted polymer solar cell of claim 1, wherein the photoactive layer is made of thieno-thiophene/benzodithiophene (PTB7):[6,6]-phenyl $C_{71}$-butyric acid methyl ester ($PC_{71}BM$).

3. The inverted polymer solar cell of claim 1, wherein the hole transport layer (HTL) is made of molybdenum trioxide ($MoO_3$).

* * * * *